United States Patent
Park

(10) Patent No.: US 9,548,407 B2
(45) Date of Patent: Jan. 17, 2017

(54) SOLAR CELL AND METHOD FOR FABRICATING THE SAME

(75) Inventor: Gi Gon Park, Seoul (KR)

(73) Assignee: LG INNOTEK CO., LTD, Seoul (KR)

( * ) Notice: Subject to any disclaimer, the term of this patent is extended or adjusted under 35 U.S.C. 154(b) by 16 days.

(21) Appl. No.: 14/351,821

(22) PCT Filed: Jul. 6, 2012

(86) PCT No.: PCT/KR2012/005375
§ 371 (c)(1),
(2), (4) Date: Aug. 8, 2014

(87) PCT Pub. No.: WO2013/055011
PCT Pub. Date: Apr. 18, 2013

(65) Prior Publication Data
US 2015/0020876 A1    Jan. 22, 2015

(30) Foreign Application Priority Data
Oct. 13, 2011   (KR) .................. 10-2011-0104744

(51) Int. Cl.
*H01L 31/032* (2006.01)
*H01L 31/046* (2014.01)
*H01L 31/054* (2014.01)

(52) U.S. Cl.
CPC ......... *H01L 31/0323* (2013.01); *H01L 31/046* (2014.12); *H01L 31/0543* (2014.12); *H01L 31/0547* (2014.12); *Y02E 10/52* (2013.01); *Y02E 10/542* (2013.01)

(58) Field of Classification Search
CPC .... H01L 31/00; H01L 31/02; H01L 31/02167; H01L 31/0232; H01L 31/02327; H01L 31/0322;H01L 31/03923; H01L 31/03928; H01L 31/0749; H01L 31/055
See application file for complete search history.

(56) References Cited

U.S. PATENT DOCUMENTS

| 5,641,973 A * | 6/1997 | Shigenaka ............ H01L 27/148 250/332 |
| 2005/0153143 A1* | 7/2005 | Minowa et al. .............. 428/432 |
| 2005/0227091 A1* | 10/2005 | Suto ........................... C08J 5/18 428/447 |

(Continued)

FOREIGN PATENT DOCUMENTS

| CN | 1719625 A | 1/2006 |
| CN | 102150276 A | 8/2011 |

(Continued)

OTHER PUBLICATIONS

International Search Report in International Application No. PCT/KR2012/005375, filed Jul. 6, 2012.

(Continued)

*Primary Examiner* — Christina Chern
(74) *Attorney, Agent, or Firm* — Saliwanchik, Lloyd & Eisenschenk

(57) ABSTRACT

Disclosed are a solar cell and a method for fabricating the same. The solar cell according to the embodiment includes a back electrode layer on a support substrate; a light absorbing layer including a glass frit having sodium on the back electrode layer; and a front electrode layer on the light absorbing layer.

11 Claims, 2 Drawing Sheets

(56) References Cited

U.S. PATENT DOCUMENTS

| | | | | |
|---|---|---|---|---|
| 2007/0193623 A1* | 8/2007 | Krasnov | ........... | H01L 31/02242 |
| | | | | 136/252 |
| 2009/0078316 A1 | 3/2009 | Khazeni et al. | | |
| 2010/0258179 A1 | 10/2010 | Wieting | | |
| 2012/0199191 A1 | 8/2012 | Lim | | |
| 2012/0282730 A1* | 11/2012 | Liao | ....................... | C09D 11/52 |
| | | | | 438/95 |

FOREIGN PATENT DOCUMENTS

| | | |
|---|---|---|
| KR | 10-2010-0034817 A | 4/2010 |
| KR | 10-2010-0074223 A | 7/2010 |
| KR | 10-2011-0047726 A | 5/2011 |
| WO | WO 2010/031010 * 3/2010 | ............. C23C 16/54 |

OTHER PUBLICATIONS

Office Action dated Oct. 26, 2015 in Chinese Application No. 201280061937.9.

* cited by examiner

SOLAR CELL AND METHOD FOR FABRICATING THE SAME

CROSS-REFERENCE TO RELATED APPLICATIONS

This application is the U.S. national stage application of International Patent Application No. PCT/KR2012/005375, filed Jul. 6, 2012, which claims priority to Korean Application No. 10-2011-0104744, filed Oct. 13, 2011, the disclosures of each of which are incorporated herein by reference in their entirety.

TECHNICAL FIELD

The embodiment relates to a solar cell and a method for fabricating the same.

BACKGROUND ART

Recently, the development of new renewable energy has become more important and interested due to the serious environmental pollution and the lack of fossil fuel. Among the new renewable energy, a solar cell is spotlighted as an energy source for solving the future energy problem because it rarely causes environmental pollution and has the semi-permanent life span and there exists infinite resources for the solar cell.

Solar cells may be defined as devices to convert light energy into electric energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

In general, the efficiency of the CIGS solar cell can be improved by diffusing sodium into a light absorbing layer. Meanwhile, according to the CIGS solar cell of the related art, the sodium may not be sufficiently supplied to the light absorbing layer or the supply of the sodium to the light absorbing layer may not be readily controlled.

DISCLOSURE OF INVENTION

Technical Problem

The embodiment provides a solar cell having the improved photoelectric conversion efficiency and a method for fabricating the same.

Solution to Problem

A solar cell according to the embodiment includes a back electrode layer on a support substrate; a light absorbing layer including a glass frit having sodium on the back electrode layer; and a front electrode layer on the light absorbing layer.

A method for fabricating a solar cell according to the embodiment includes the steps of forming a back electrode layer on a support substrate; forming a light absorbing layer including a glass frit having sodium on the back electrode layer; and forming a front electrode layer on the light absorbing layer.

Advantageous Effects of Invention

According to the solar cell of the embodiment, the glass frit including sodium is formed on the light absorbing layer so that the sodium contained in the glass frit can be directly diffused into the light absorbing layer. Thus, the solar cell according to the embodiment may not require a separate sodium supply layer and may have the optimal photoelectric conversion efficiency by adjusting the concentration of sodium in the glass frit.

In addition, the optical path of solar light incident into the light absorbing layer may be changed by the glass frit. That is, the glass frit can lengthen the optical path of the solar light in the light absorbing layer. Thus, the solar cell according to the embodiment may have the improved power generation efficiency.

MODE FOR THE INVENTION

Figure 1:
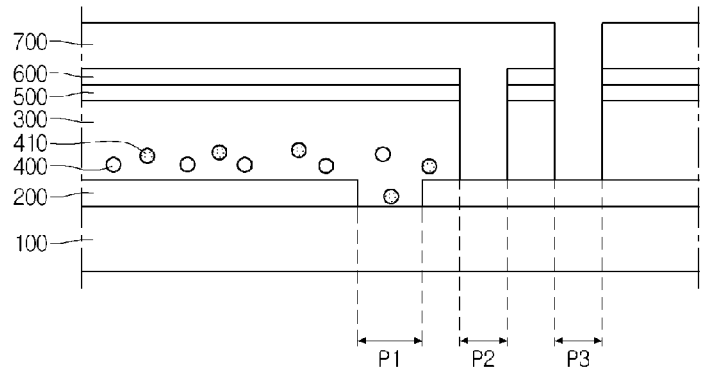
FIG. 1 is a sectional view showing a solar cell according to the embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIG. 1 is a sectional view showing a solar cell according to the embodiment. Referring to FIG. 1, the solar cell according to the embodiment includes a support substrate 100, a back electrode layer 200, a light absorbing layer 300, a glass frit 400 including sodium 410, a buffer layer 500, a high-resistance buffer layer 600, and a front electrode layer 700.

The support substrate 100 supports the back electrode layer 200, the light absorbing layer 300, the glass frit 400 including the sodium 410, the buffer layer 500, the high-resistance buffer layer 600 and the front electrode layer 700.

The support substrate 100 has high strength. In addition, the support substrate 100 may be rigid or flexible. For example, the support substrate 100 may include a glass substrate, a ceramic substrate, such as alumina, a stainless steel substrate, a titanium substrate or a polymer substrate. In addition, the solar cell according to the embodiment supplies the sodium into the light absorbing layer 300 from the glass frit 400 including the sodium. The support substrate 100 may not include impurities, such as the sodium.

The back electrode layer 200 is provided on the support substrate 100. The back electrode layer 200 is a conductive layer. The back electrode layer 200 may include one selected from the group consisting of molybdenum (Mo), gold (Au), aluminum (Al), chrome (Cr), tungsten (W), and copper (Cu). Among the above materials, the Mo has a thermal expansion coefficient similar to that of the support substrate 100, so the Mo may improve the adhesive property and prevent the back electrode layer 200 from being delaminated from the support substrate 100.

The light absorbing layer 300 is provided on the back electrode layer 200. The light absorbing layer 300 includes a group I-III-VI compound. For example, the light absorbing layer 300 may have the CIGSS ($Cu(IN,Ga)(Se,S)_2$) crystal structure, the CISS ($Cu(IN)(Se,S)_2$) crystal structure or the CGSS ($Cu(Ga)(Se,S)_2$) crystal structure. In addition, the light absorbing layer 300 has the bandgap energy in the range of about 1 eV to about 1.8 eV.

The light absorbing layer 300 includes the glass frit 400 having the sodium 410.

Figure 2:
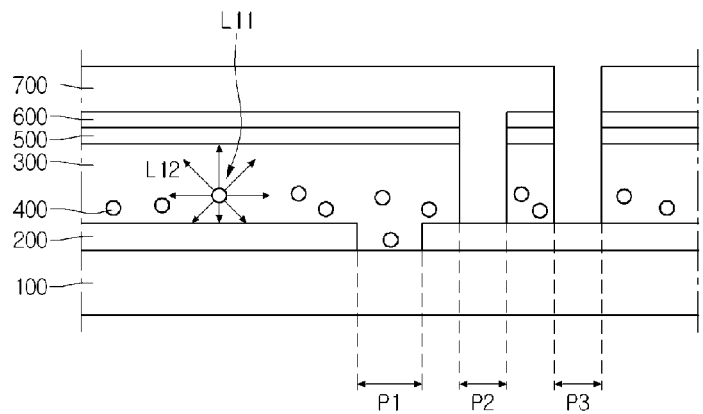
FIG. 2 is a sectional view showing the change of the light path by a glass frit according to the embodiment.

Referring to FIG. 2, the glass frit 400 can change the optical path of solar light L11 incident into the solar cell. The solar light L11 incident into the solar cell may be emitted in all directions L12 by the glass frit 400. That is, the incident solar light L11 can be emitted in all directions L12 by the glass frit 400, so the optical path in the light absorbing layer 300 can be lengthened. Thus, the photoelectric conversion efficiency of the solar cell according to the embodiment can be improved.

The glass frit can be sintered through the heat treatment process. Various types of glass frits, which are generally known in the art, can be employed without limitation. For instance, a $SiO_2$ glass frit, a $SiO_2$—ZnO (Si—Zn—O) glass frit, a $SiO_2$—$B_2O_3$ (Si—B—O) glass frit and a $SiO_2$—$Bi_2O_3$ (Si—Bi—O) glass frit can be employed, but the embodiment is not limited thereto. The $SiO_2$ glass frit includes $SiO_2$ as a main component, and the $SiO_2$—ZnO glass frit includes $SiO_2$ as a main component and ZnO as a sub-component. In addition, the glass frit may further include oxide in addition to the main component and the sub-component. The oxide may include one or at least two selected from the group consisting of $Al_2O_3$, $Ta_2O_5$, $Sb_2O_5$, $ZrO_2$, $HfO_2$, $In_2O_3$, $Ga_2O_3$, $Y_2O_3$ and $Yb_2O_3$.

The glass frit 400 may have various shapes generally known in the art without limitation. For instance, the glass frit 400 may have a sectional shape of a polygon, a semi-circle, a circle or an oval, but the embodiment is not limited thereto.

The glass frit 400 has an average size in the range of about 0.1 μm to about 0.5 μm. In detail, the glass frit 400 has an average size in the range of about 0.1 μm to about 0.3 μm, but the embodiment is not limited thereto.

The distribution degree of the glass frit 400 may vary depending on the position in the light absorbing layer 300.

According to one embodiment, the distribution degree of the glass frit 400 may be reduced as the glass frit 400 is located away from the back electrode layer 200. For instance, the amount of the glass frit 400 is highest at the interfacial surface between the light absorbing layer 400 and the back electrode layer 200. In addition, the amount of the glass frit 400 is lowest at the interfacial surface between the light absorbing layer 400 and the buffer layer 500 formed on the light absorbing layer 300. For instance, the glass frit 40 may not exist at the interfacial surface between the light absorbing layer 400 and the buffer layer 500.

According to another embodiment, the light absorbing layer 300 may be divided by the glass frit 400. In detail, the light absorbing layer 300 may include a first light absorbing layer (not shown) located at the region adjacent to the back electrode layer 200 and distributed at a first concentration; and a second light absorbing layer (not shown) formed on the first light absorbing layer and distributed at a second concentration.

The first concentration is higher than the second concentration. That is, the amount of the glass frit 400 in the first light absorbing layer located at the region adjacent to the back electrode layer 200 is higher than the amount of the glass frit 400 in the second light absorbing layer located away from the back electrode layer 200. Although the first light absorbing layer is distinguished from the second light absorbing layer in this specification for the purpose of convenience, the embodiment is not limited thereto.

The glass frit 400 may include the sodium (Na). For instance, the sodium 410 contained in the glass frit 400 may have the particle shape as shown in FIG. 1.

The sodium 410 contained in the glass frit 400 may diffuse into the light absorbing layer 300 when the heat treatment process is performed during the manufacturing process for the solar cell. That is, the solar cell according to the embodiment can effectively control the amount of the sodium 410 diffused into the light absorbing layer 300 by adjusting the amount of the sodium 410 contained in the glass frit 400. Thus, the solar cell according to the embodiment can improve the open-circuit voltage and fidelity, so that the photoelectric conversion efficiency of the solar cell can be improved.

The concentration of the sodium 410 in the glass frit 400 is in the range of about 5 wt % to about 25 wt %. In detail, the concentration of the sodium 410 in the glass frit 400 is in the range of about 15 wt % to about 20 wt %, but the embodiment is not limited thereto. That is, the sodium 410 contained in the glass frit 400 may diffuse into the light absorbing layer 300 during the manufacturing process for the solar cell, so only a little amount of the sodium 410 may remain in the glass frit 400.

The buffer layer 500 is provided on the light absorbing layer 300. The buffer layer 500 may include CdS, ZnS, InXSY or InXSeYZn(O, OH). The buffer layer 500 may have the thickness in the range of about 50 nm to about 150 nm and the energy bandgap in the range of about 2.2 eV to about 2.4 eV The high-resistance buffer layer 600 is disposed on the buffer layer 500. The high-resistance buffer layer 600 includes i-ZnO, which is not doped with impurities. The high-resistance buffer layer 600 may have the energy bandgap in the range of about 3.1 eV to about 3.3 eV. The high-resistance buffer layer 600 can be omitted.

The front electrode layer 700 may be provided on the light absorbing layer 300. For example, the front electrode layer 700 may directly make contact with the high-resistance buffer layer 600 formed on the light absorbing layer 300.

The front electrode layer 700 may include a transparent conductive material. In addition, the front electrode layer 700 may have the characteristics of an N type semiconductor. In this case, the front electrode layer 700 forms an N type semiconductor together with the buffer layer 500 to make a PN junction together with the light absorbing layer 300 serving as a P type semiconductor layer. For instance, the front electrode layer 700 may include aluminum-doped zinc oxide (AZO). The front electrode layer 700 may have a thickness in the range of about 100 nm to about 500 nm.

FIGS. 3 to 6 are sectional views showing the method of fabricating the solar cell according to the embodiment. The above description about the solar cell will be incorporated herein by reference.

Figure 3:
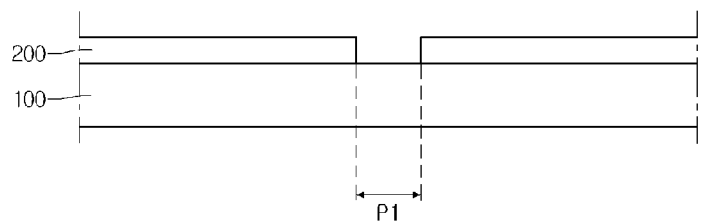
FIGS. 3 to 6 are sectional views showing a method for fabricating a solar cell module according to the embodiment.

Referring to FIG. 3, the back electrode layer 200 is formed on the support substrate 100 and a first pattern P1 is formed on the back electrode layer 200.

The back electrode layer 200 may be formed through a PVD (Physical Vapor Deposition) scheme or a plating scheme. The back electrode layer 100 includes the first pattern P1. That is, the back electrode layer 200 can be patterned by the first pattern P1. The first pattern P1 may have various shapes, such as a stripe shape shown in FIG. 3 or a matrix shape. For instance, the width of the first pattern P1 may be in the range of about 80 μm to about 200 μm, but the embodiment is not limited thereto.

Figure 4:
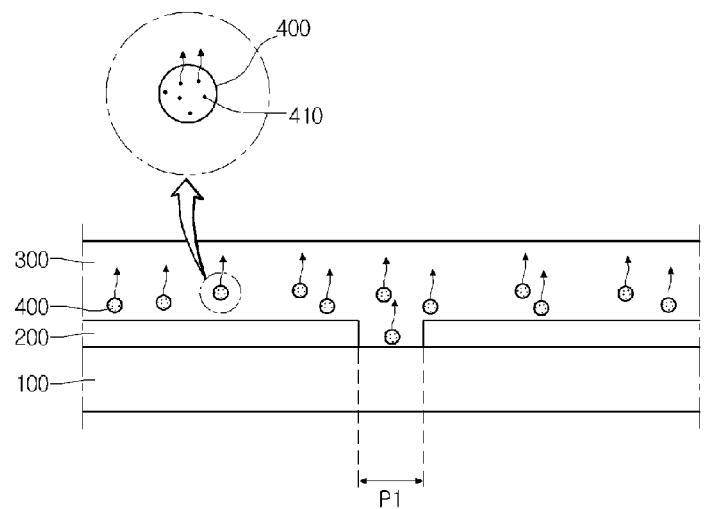

Referring to FIG. 4, the light absorbing layer 300 including the glass frit 400 having the sodium 410 is formed on the back electrode layer 200. The sodium 410 contained in the glass frit 400 may diffuse into the light absorbing layer 300 when the light absorbing layer 300 is formed.

The glass frit 400 can be prepared by providing a glass paste including the sodium 410 and then heat-treating the glass paste.

The glass paste may include sodium particles, a glass frit, conductive powder, a binder and a solvent. In addition, the glass paste may further include a dispersing medium to improve the dispersion property of solid components. The concentration of the sodium 410 is in the range of about 5 wt % to about 25 wt %. In detail, the concentration of the sodium 410 is in the range of about 15 wt % to about 20 wt %, but the embodiment is not limited thereto. In addition, other compositions constituting the glass paste can be used without specific limitations of the concentration if they are generally used in the art.

The glass paste prepared according to the above process is printed or coated on the back electrode layer 200 through a dip coating scheme, a screen printing scheme, a roll printing scheme or a table coating scheme.

After that, the glass frit 400 is formed by heat-treating the glass paste. The heat treatment process includes drying, preheating and backing processes for the glass paste. The preheating process can be performed for about 10 minutes to about 60 minutes in the temperature of about 200° C. to about 400° C., but the embodiment is not limited thereto. At this time, organic materials, such as the solvent and the binder contained in the conductive paste, can be removed. Then, the conductive paste is baked in the temperature of about 450° C. to about 600° C.

At the same time, the light absorbing layer 300 is formed. That is, the process for forming the glass frit 400 can be performed simultaneously with the process for forming the light absorbing layer 300.

The light absorbing layer 300 can be formed through the sputtering process or the evaporation process. In detail, in order to form the light absorbing layer 300, a CIG metallic precursor layer is formed on the back electrode layer 200 by using Cu, In and Ga targets. The metallic precursor layer reacts with Se through the selenization process, so that the CIGS light absorbing layer 300 can be formed.

The process for forming the metallic precursor layer and the selenization process are performed in the temperature of about 350° C. to about 550° C., and the sodium 410 contained in the glass frit 400 diffuses into the light absorbing layer 300.

Figure 5:
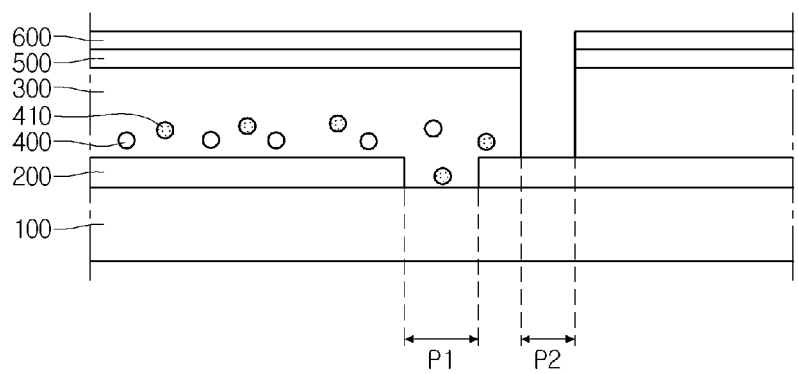

Referring to FIG. 5, the buffer layer 500 and the high-resistance buffer layer 600 are formed on the light absorbing layer 300.

The buffer layer 500 may be formed by depositing CdS on the light absorbing layer 300 through a CBD (Chemical Bath Deposition) scheme. In addition, ZnO is deposited on the buffer layer 500 through the sputtering process, thereby forming the high-resistance buffer layer 600.

Then, the second pattern P2 is formed through the light absorbing layer 300, the buffer layer 500 and the high-resistance buffer layer 600. The second pattern P2 may be formed on the glass frit 400. The second pattern P2 can be formed through the mechanical scheme such that the back electrode layer 200 can be partially exposed. The second pattern P2 may have a width in the range of about 80 μm to about 200 μm, but the embodiment is not limited thereto.

Figure 6:
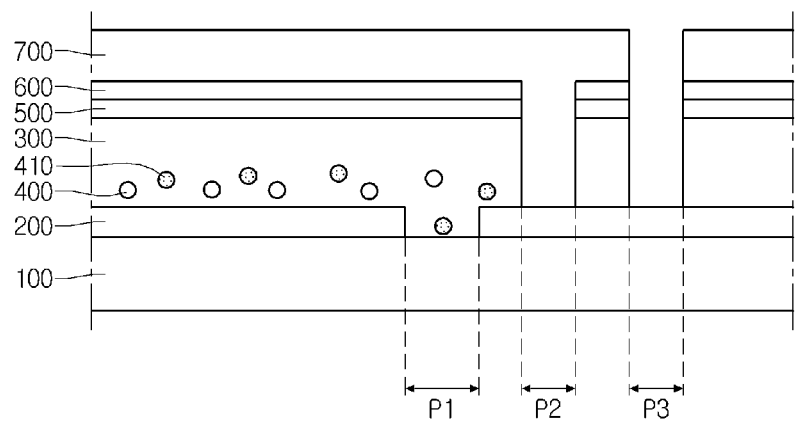

Referring to FIG. 6, the front electrode layer 700 is formed on the high-resistance buffer layer 600 by depositing transparent conductive materials on the high-resistance buffer layer 600. The front electrode layer 700 can be formed by forming a front electrode on the light absorbing layer 300 and then forming third patterns P3 for dividing the front electrode. The third patterns P3 can be formed through the mechanical scheme such that the back electrode layer 200 can be partially exposed. The third patterns P3 may have a width in the range of about 80 μm to about 200 μm, but the embodiment is not limited thereto.

Referring to FIG. 6, the third patterns P3 are formed through the light absorbing layer 300, the buffer layer 500, the high-resistance buffer layer 600 and the front electrode layer 700. That is, solar cells C1, C2 . . . and Cn may be separated from each other by the third patterns P3.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a back electrode layer on a support substrate;
a light absorbing layer including a plurality of glass frits having sodium on the back electrode layer;
a buffer layer on the light absorbing layer; and
a front electrode layer on the buffer layer;
wherein the light absorbing layer includes a CIGSS $(Cu(In,Ga)(Se,S)_2)$ crystal structure, a CISS $(Cu(In)(Se,S)_2)$ crystal structure, or a CGSS $(Cu(Ga)(Se,S)_2)$ crystal structure;
wherein the back electrode layer, the light absorbing layer, the buffer layer, and the front electrode layer are sequentially formed on the support substrate;
wherein the back electrode layer makes contact with the support substrate and the light absorbing layer, wherein the plurality of glass frits is distributed ranging from an interfacial surface between the back electrode layer and the light absorbing layer to an interfacial surface between the light absorbing layer and the buffer layer with different concentration gradients, and wherein a distribution of the plurality of glass frits is gradually reduced as the plurality of glass frits is located away from the interfacial surface between the back electrode layer and the light absorbing layer wherein the plurality of glass frits includes a SiO2 glass frit, a SiO2-ZnO (Si—Zn—O) glass frit, a SIO2-B2O3 (Si—B—O) glass frit or a SiO2-Bi2O3 (Si—Bi—O) glass frit.

2. The solar cell of claim 1, wherein the light absorbing layer comprises:
   a first light absorbing layer disposed in a region adjacent to the back electrode layer and including the plurality of glass frits distributed at a first concentration; and
   a second light absorbing layer disposed on the first light absorbing layer and including the plurality of glass frits distributed at a second concentration, and
   wherein the first concentration is higher than the second concentration.

3. The solar cell of claim 1, wherein the plurality of glass frits has a size in a range of 0.1 μm to 0.5 μm.

4. The solar cell of claim 1, wherein the plurality of glass frits has a size in a range of 0.1 μm to 0.3 μm.

5. The solar cell of claim 1, wherein the plurality of glass frits has a sectional shape of a polygon, a semicircle, a circle or an oval.

6. The solar cell of claim 1, wherein a concentration of the sodium in the plurality of glass frits is in a range of 5 wt % to 25 wt %.

7. The solar cell of claim 1, wherein a concentration of the sodium in the plurality of glass frits is in a range of 15 wt % to 20 wt %.

8. The solar cell of claim 1, wherein the plurality of glass frits includes at least one oxide selected from the group consisting of $Al_2O_3$, $Ta_2O_5$, $Sb_2O_5$, $ZrO_2$, $HfO_2$, $In_2O_3$, $Ga_2O_3$, $Y_2O_3$, and $Yb_2O_3$.

9. The solar cell of claim 1, wherein the support substrate is free of sodium.

10. The solar cell of claim 1, wherein the plurality of glass frits changes an optical path of solar light incident into the solar cell.

11. The solar cell of claim 1, wherein the sodium contained in the plurality of glass frits diffuses into the light absorbing layer by a heat treatment process.

* * * * *